(12) United States Patent
Gambin et al.

(10) Patent No.: US 10,727,050 B1
(45) Date of Patent: Jul. 28, 2020

(54) WAFER-SCALE CATALYTIC DEPOSITION OF BLACK PHOSPHORUS

(71) Applicant: NORTHROP GRUMMAN SYSTEMS CORPORATION, Falls Church, VA (US)

(72) Inventors: Vincent Gambin, Rancho Palos Verdes, CA (US); Loan T. Le, Redondo Beach, CA (US); Michael D. Lange, Anaheim, CA (US); Jesse B. Tice, Torrance, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 401 days.

(21) Appl. No.: 15/488,084

(22) Filed: Apr. 14, 2017

Related U.S. Application Data

(60) Provisional application No. 62/350,580, filed on Jun. 15, 2016.

(51) Int. Cl.
  *H01L 21/02*   (2006.01)
  *H01L 21/324*   (2006.01)

(52) U.S. Cl.
  CPC .... *H01L 21/02543* (2013.01); *H01L 21/0242* (2013.01); *H01L 21/0257* (2013.01); *H01L 21/0262* (2013.01); *H01L 21/02378* (2013.01); *H01L 21/02381* (2013.01); *H01L 21/02491* (2013.01); *H01L 21/02645* (2013.01); *H01L 21/324* (2013.01)

(58) Field of Classification Search
  CPC ...... C08L 67/02; C08L 69/00; C08L 2666/02; C08L 79/08; C08L 2666/18
  See application file for complete search history.

(56) References Cited

U.S. PATENT DOCUMENTS

| | | | |
|---|---|---|---|
| 5,032,472 A | * | 7/1991 | Michel .................. C01B 25/003 428/704 |
| 6,110,438 A | | 8/2000 | Baillargeon et al. |

(Continued)

FOREIGN PATENT DOCUMENTS

| | | |
|---|---|---|
| CN | 104807869 A | 7/2015 |
| JP | 10-335691 A | 12/1998 |

(Continued)

*Primary Examiner* — Tony Tran
(74) *Attorney, Agent, or Firm* — Shumaker, Loop & Kendrick, LLP; John A. Miller

(57) ABSTRACT

A method for wafer-level deposition of a semiconductor layer structure including at least one two-dimensional black phosphorus layer. The method includes providing a wafer substrate and a metal catalyst layer on the substrate. The method includes heating a phosphorus material to generate a $P_4$ flux and heating the $P_4$ flux to generate a $P_2$ flux, where the $P_2$ flux is deposited on the metal catalyst layer using molecular beam epitaxy or chemical vapor deposition. The process of depositing the black phosphorus layer can include adding a dopant or alloy to the $P_2$ flux to modify the band gap of the phosphorus layer. The method includes heating the substrate to a temperature above a temperature that causes red phosphorus to evaporate from the substrate, but does not cause black phosphorus to evaporate from the substrate.

19 Claims, 2 Drawing Sheets

(56) References Cited

U.S. PATENT DOCUMENTS

| | | |
|---|---|---|
| 7,744,023 B2 | 6/2010 | Park et al. |
| 2005/0241670 A1 | 11/2005 | Dong et al. |
| 2007/0006893 A1 | 1/2007 | Ji |
| 2008/0231170 A1 | 9/2008 | Masato et al. |
| 2016/0126323 A1 | 5/2016 | Lee et al. |
| 2016/0343805 A1* | 11/2016 | Lee .................. H01L 29/04 |
| 2018/0138039 A1* | 5/2018 | Kwon ................ H01L 21/205 |

FOREIGN PATENT DOCUMENTS

| | | |
|---|---|---|
| KR | 10-1522350 B1 | 5/2015 |
| WO | 2016018988 A1 | 2/2016 |

\* cited by examiner

WAFER-SCALE CATALYTIC DEPOSITION OF BLACK PHOSPHORUS

CROSS-REFERENCE TO RELATED APPLICATIONS

This application claims the benefit of the priority date of U.S. Provisional Patent Application Ser. No. 62/350,580, titled, Wafer-Scale Catalytic Deposition of Black Phosphorous, filed Jun. 15, 2016.

BACKGROUND

Field

This invention relates generally to a process for fabricating two-dimensional semiconductor materials and, more particularly, to a wafer-level fabrication process for fabricating semiconductor materials, where the process includes providing a two-dimensional black phosphorus layer formed on a catalyst layer.

Discussion

A three-dimensional atomic crystal has a crystalline structure in all three dimensions and a two-dimensional material only has a crystalline structure in the x and y direction. The use of two-dimensional materials for semiconductor devices is currently receiving a lot of interest in the art for at least the reason that they provide unique properties not present in three-dimensional materials. Further, stacked two-dimensional material layers provide van der Waals bonding between the layers as opposed to covalent bonding as in traditional three-dimensional semiconductor materials, where the stacked two-dimensional material layers can have fewer defects and a disregard to a lattice constant when integrated into heterostructures.

The recent discovery of graphene as a viable semiconductor material has driven the interest in two-dimensional materials, where graphene is an allotrope of carbon provided in the form of a two-dimensional, atomic-scale, honeycomb lattice having a one atom thickness, which can be grown and transferred onto a semiconductor substrate. Another two-dimensional material that is currently receiving interest because of its desirable properties is black phosphorus. These desirable properties include a direct band gap that is tunable with a layer thickness from 0.3-2.0 eV, high carrier mobility at room temperature, a high on/off ratio ($10^6$), and strong in-plane anisotropy. Further, black phosphorus provides large optical conductivity for infrared (IR) optoelectronics.

Depositing phosphorus onto a substrate so that it becomes a two-dimensional black phosphorus layer that has desirable optical and electrical properties without converting the phosphorus to other phases, such as red, white, etc., that do not have the desirable properties, is difficult to achieve with current technology. Current wafer-level semiconductor fabrication techniques, such as chemical vapor deposition (CVD), typically produce other phases of phosphorus that do not have the two-dimensional crystalline structure. Specifically, by depositing phosphorus on a semiconductor substrate using CVD or other semiconductor fabrication processes, the resulting phosphorus would be red amorphous phosphorus, which does not provide any of the two-dimensional material properties.

The current state of the art does include various techniques for producing two-dimensional black phosphorus. For example, two-dimensional black phosphorus can be produced as a bulk material under high pressure. From this bulk material, a single to a few monolayers are exfoliated and transferred to a substrate. Also, black phosphorus bulk crystals can be prepared in a solution based on reaction-promoter chemistry, which may introduce contaminants such as Bi and $SnI_4$.

The known techniques for obtaining two-dimensional black phosphorus do not provide black phosphorus in a manner that would be effective for wafer-level semiconductor fabrication. For example, semiconductor devices are typically fabricated on wafers where several devices are simultaneously fabricated, and then the devices are separated from the wafer to be used in a particular circuit. Thus, the biggest challenge for black phosphorus synthesis is to fabricate wafer scale samples for device processing, and preserving those samples as black phosphorus without undergoing a photocatalyic reaction at ambient conditions, which ruins the desired properties.

DETAILED DESCRIPTION OF THE EMBODIMENTS

The following discussion of the embodiments of the invention directed to a wafer-level process for depositing a two-dimensional black phosphorus layer on a semiconductor substrate is merely exemplary in nature, and is in no way intended to limit the invention or its applications or uses.

The present invention proposes a wafer-level deposition technique for producing two-dimensional black phosphorus that includes directly depositing phosphorus in a vacuum using, for example, molecular beam epitaxy (MBE) or chemical vapor deposition (CVD), across an entire semiconductor wafer. It has been shown that on non-reactive substrates at high temperatures, a phosphorus gas or flux will not condense on the substrate and will re-evaporate off of the wafer. At low enough temperatures, only red or white phosphorus phase material will be deposited. However, by employing a catalytic metal layer, it has been observed that the black phosphorus material will be deposited on the substrate, even at high temperatures, and will crystallize into a black allotrope with the desired orthorhombic phase.

Figure 1:
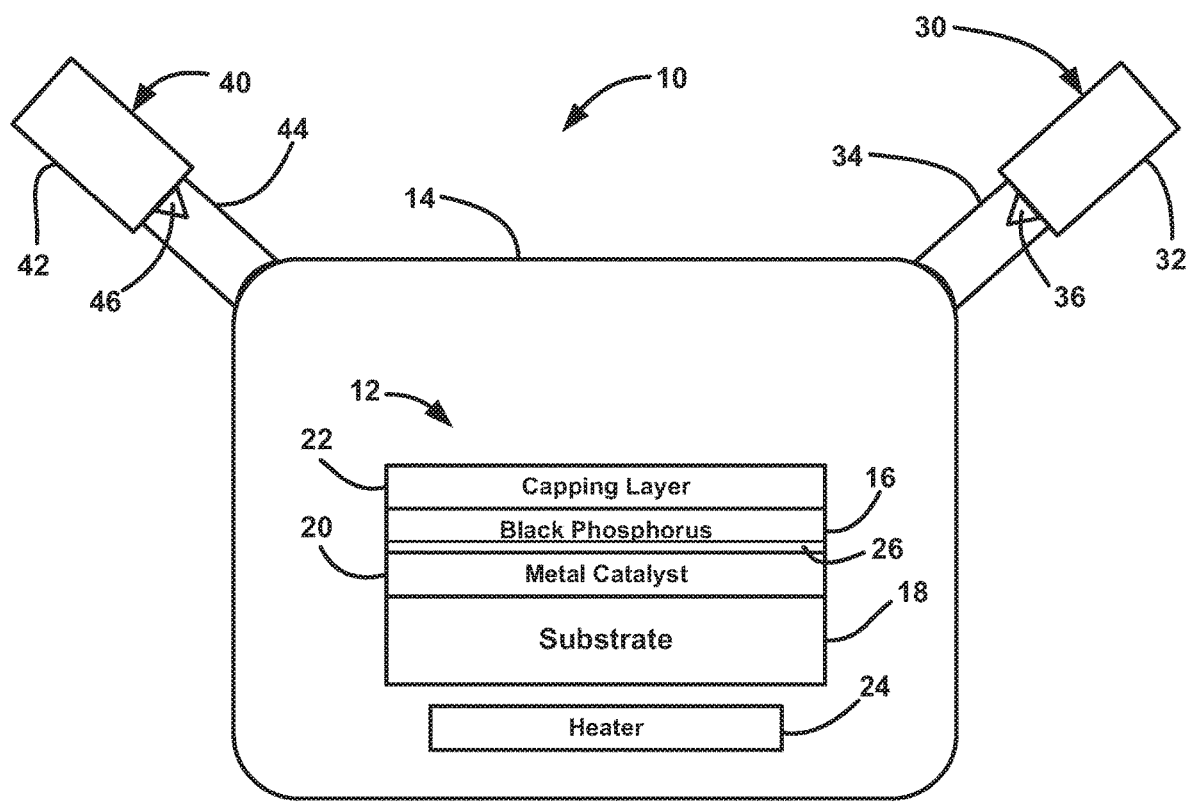
FIG. 1 is an illustration of a semiconductor deposition system for depositing a two-dimensional black phosphorus layer on a semiconductor substrate.

FIG. 1 is an illustration of a deposition system 10 for a depositing a semiconductor layer structure 12 within a vacuum chamber 14. As will be discussed in detail below, a black phosphorus layer 16 is deposited on a semiconductor wafer substrate 18, such as 2 inches to 450 mm in diameter, where the layer 16 adheres to the substrate 18 by use of a metal catalyst layer 20 already deposited on the substrate 18. Although not specifically shown, an adhesion layer, such as titanium, may be provided between the substrate 18 and the catalyst layer 20 to allow the catalyst layer 20 to better adhere thereto. As discussed above, two-dimensional layers provide a number of desirable electrical properties in a semiconductor device, where the layer may be a single atomic layer in thickness. Multiple layers of the two-dimensional atomic layer can be stacked on top of each other to provide different electrical properties, such as changes in material band gap, where the multiple layers are not bonded in a vertical direction by covalent bonds, but are instead bonded by van der Waals bonding. In this regard, the black phosphorus layer 16 may be a single black phosphorus layer, generally represented as layer 26, or may be multiple two-dimensional black phosphorus layers. Thus, by using a vacuum deposited process, a single layer of the black phosphorus can be deposited, which has one band gap, and as multiple two-dimensional layers are deposited, the band gap of the entire black phosphorus layer changes.

In one embodiment, the structure 12 is a field effect transistor (FET) structure where the black phosphorus layer 16 is a channel layer, and where the various other semiconductor layers, such as barrier layers, buffer layers, etc., and the source, drain and gate terminals are not shown. The substrate 18 can be any substrate suitable for the structure 12 being fabricated, where non-limiting examples include Si, sapphire, SiC, $SiO_2$, etc. The metal layer 20 is deposited on the substrate 18 by any suitable technique, such as evaporation or sputtering, where the specific metal catalyst is a noble metal or a non-refractory metal, where suitable examples include platinum (Pt), palladium (Pd), tungsten (W), nickel (Ni), tantalum (Ta), etc. It is noted that the substrate 18 including the metal catalyst layer 20 is fabricated in a process outside of the vacuum chamber 14, and is introduced into the vacuum chamber 14 as a single unit. A heater 24 is positioned in the chamber 14 proximate the structure 12 and provides the heat necessary for allowing black phosphorus to form on the catalyst layer 20 and prevent amorphous red phosphorus from being deposited.

The system 10 includes a source 30 of phosphorus, where elemental phosphorus is heated within a sublimation chamber 32, which produces a $P_4$ vapor flux or gas, i.e., compounds of four bound phosphorus atoms. The $P_4$ flux is provided to a cracking chamber 34 through a valve 36, which is heated to a high temperature, such as 800° to 1000° C. The cracking chamber 34 includes a series of baffles (not shown) that convert the $P_4$ vapor flux to a $P_2$ vapor flux that is introduced into the vacuum chamber 14 to be deposited on the substrate 18. By selectively controlling the temperature of the cracking chamber 34, the conversion of the $P_4$ flux to the $P_2$ flux can be tightly controlled. More specifically, under heating, the bonds between the atoms of phosphorus will crack or breakdown, which converts the $P_4$ groups of phosphorus atoms to the $P_2$ groups of phosphorus atoms. By converting the $P_4$ flux to the $P_2$ flux, the catalytic action provided by the catalyst layer 20 will cause the phosphorus to crystallize as it is deposited thereon forming the two-dimensional black phosphorus layer 16. Particularly, the metal catalyst layer 20 provides the ability for the $P_2$ flux to crystallize on the surface of the layer 20, where the layer 20 may have a thickness in the range of 10-10,000 Å. It is noted that red phosphorus will evaporate at about 70° C. and black phosphorus will evaporate at about 200° C. Thus, by using the heater 24 to heat the substrate 18 to a temperature above 70° C., but below 200° C., the red phosphorus is not deposited and the black phosphorus is deposited.

The discussion above refers to tuning the band gap of the black phosphorus layer 16 by controlling the number of the two-dimensional layers that are deposited. Further, the band gap and other properties can be controlled by adding a dopant or alloy to the black phosphorus layer 16. In order to provide the dopant or alloy, a dopant source 40 is provided that also includes a sublimation chamber 42 for heating an elemental dopant that is sent to a cracking zone 44 through a valve 46 to control the molecular content of a dopant flux, where suitable dopants include arsenic (As), antimony (Sb), tellurium (Te), etc. By adding more dopant to the black phosphorus layer 16, the band gap can be decreased, where the layer 16 may be able to generate light in the infrared region.

The structure 12 also includes an optional capping layer 22 deposited on the black phosphorus layer 16, and can be employed to prevent the black phosphorus layer 16 from oxidizing after it is removed from the vacuum chamber 14. In one embodiment, the capping layer 22 is an aluminum layer, which will oxidize when it is removed from the vacuum chamber 14, and which when oxidized can also operate as a gate dielectric.

Figure 2:
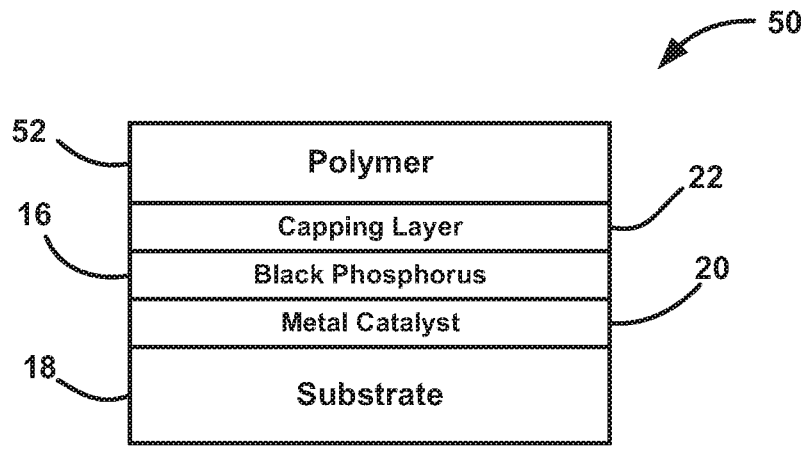
FIGS. 2-5 are profile views of a semiconductor layer structure including a black phosphorus layer being attached to a dissimilar two-dimensional material layer.
Figure 3:
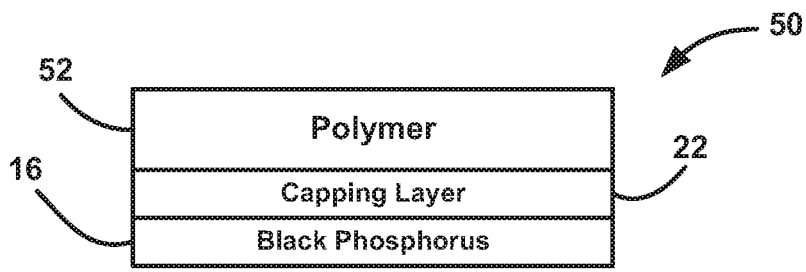
Figure 4:
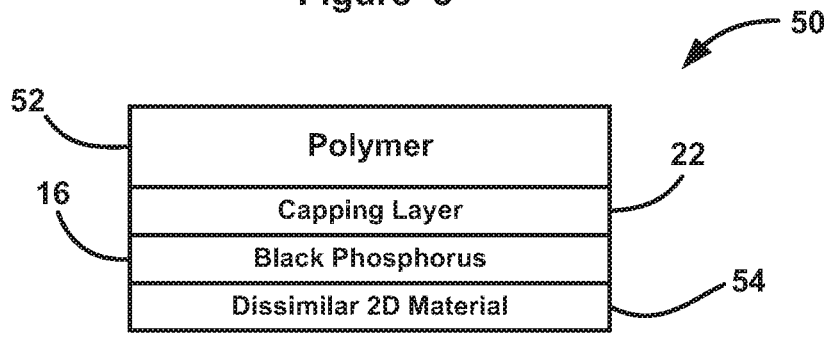
Figure 5:
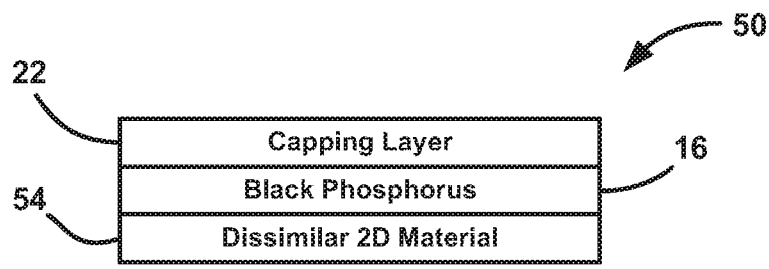

Once the structure 12 is fabricated in the vacuum chamber 14, it can be separated from the substrate 18 while still in the wafer format to create heterostructure stacks with other two-dimensional materials, such as graphene, boron nitride, molybdenum disulfide, etc. This technique is illustrated in FIGS. 2-5, where FIG. 2 shows a semiconductor structure 50 that is a combination of the structure 12 and a polymer layer 52, where the layer 52 is secured to the capping layer 22 to allow the structure 12 to be manipulated during the fabrication process. The structure 50 can be immersed in an acid or base etch to dissolve the catalyst layer 20, which releases the substrate 18 from the structure 12, as shown in FIG. 3. Now that the surface of the black phosphorus layer 16 is exposed opposite to the capping layer 22, another dissimilar two-dimensional material layer 54, such as graphene, boron nitride, molybdenum disulfide, etc., can be adhered to this surface of the black phosphorus layer 16 by any suitable wafer fabrication technique, as shown in FIG. 4. Once the heterostructure stack is formed, then the polymer layer 52 can be removed to provide the final structure 50, as shown in FIG. 5.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for depositing a semiconductor layer structure, said method comprising:
   providing a wafer substrate;
   providing a metal catalyst layer on the wafer substrate;
   depositing at least one black phosphorus monolayer on the metal catalyst layer by heating a phosphorus material to generate a phosphorus flux that adheres to the metal catalyst layer; and
   heating the wafer substrate to a temperature above a temperature that causes red phosphorus to evaporate from the wafer substrate, but does not cause black phosphorus to evaporate from the wafer substrate.

2. The method according to claim 1 wherein depositing at least one black phosphorus monolayer includes heating the phosphorus flux so as to convert the phosphorus flux from a $P_4$ flux to a $P_2$ flux.

3. The method according to claim 2 wherein depositing at least one black phosphorus monolayer includes heating the phosphorus material to produce the $P_4$ flux at one temperature and then heating the $P_4$ flux to a higher temperature in a cracking chamber.

4. The method according to claim 1 wherein depositing at least one black phosphorus monolayer includes depositing a dopant or alloy in combination with the phosphorus flux.

5. The method according to claim 4 wherein depositing the dopant or alloy includes depositing one or more of arsenic, antimony or tellurium.

6. The method according to claim 1 wherein providing a metal catalyst layer includes providing a platinum, palladium, tungsten, nickel or tantalum layer.

7. The method according to claim 1 wherein depositing at least one black phosphorus monolayer includes depositing a plurality of black phosphorus monolayers.

8. The method according to claim 1 further comprising depositing a capping layer on the at least one black phosphorus monolayer so as to prevent the black phosphorus layer from oxidizing.

9. The method according to claim 8 wherein the capping layer operates as a gate dielectric.

10. The method according to claim 8 wherein depositing a capping layer on the at least one black phosphorus monolayer includes depositing an aluminum layer.

11. The method according to claim 1 further comprising removing the metal catalyst layer on the substrate, and adhering a dissimilar two-dimensional layer to the at least one black phosphorus monolayer.

12. The method according to claim 11 wherein the dissimilar two-dimensional layer is selected from the group consisting of graphene, hexagonal boron nitride or molybdenum disulfide.

13. The method according to claim 1 wherein depositing at least one black phosphorus monolayer includes employing a molecular beam epitaxy or chemical vapor deposition vacuum deposition process.

14. The method according to claim 1 wherein the wafer substrate is selected from the group consisting of Si, sapphire, SiC and $SiO_2$.

15. The method according to claim 1 wherein the method is a wafer-level process and providing a substrate includes providing a substrate having a diameter in the range of 2 inches to 450 mm.

16. The method according to claim 1 further comprising fabricating the semiconductor layer structure into a field effect transistor device.

17. A method for wafer-level deposition of a semiconductor layer structure, said method comprising:
providing a wafer substrate;
providing a metal catalyst layer on the wafer substrate;
depositing one or more two-dimensional black phosphorus layers on the metal catalyst layer by molecular beam epitaxy or chemical vapor deposition, where depositing the one or more black phosphorus layers includes heating a phosphorus material to generate a phosphorus flux including a $P_4$ flux and heating the $P_4$ flux to generate a $P_2$ flux; and
heating the substrate to a temperature above a temperature that causes red phosphorus to evaporate from the substrate, but does not cause black phosphorus to evaporate from the substrate.

18. The method according to claim 17 wherein depositing one or more black phosphorus layers includes depositing a dopant or alloy in combination with the phosphorus flux.

19. A method for wafer-level deposition of a semiconductor layer structure, said method comprising:
providing a wafer substrate;
providing a metal catalyst layer on the wafer substrate;
depositing one or more two-dimensional black phosphorus layers on the metal catalyst layer by molecular beam epitaxy or chemical vapor deposition, where depositing the one or more black phosphorus layers includes heating a phosphorus material to generate a phosphorus flux including a $P_4$ flux and heating the $P_4$ flux to generate a $P_2$ flux and depositing a dopant or alloy in combination with the phosphorus flux;
heating the substrate to a temperature above a temperature that causes red phosphorus to evaporate from the substrate, but does not cause black phosphorus to evaporate from the substrate;
removing the metal catalyst layer on the substrate; and
adhering a dissimilar two-dimensional layer to the at least one black phosphorus monolayer.

\* \* \* \* \*